United States Patent [19]

Tachimori et al.

[11] Patent Number: 5,373,804
[45] Date of Patent: Dec. 20, 1994

[54] SINGLE SILICON CRYSTAL HAVING LOW OSF DENSITY INDUCED BY OXIDATION AND METHOD FOR PRODUCTION THEREOF

[75] Inventors: Masaharu Tachimori; Tadashi Sakon; Takayuki Kaneko; Seizou Meguro, all of Hikari, Japan

[73] Assignees: Nippon Steel Corporation; NSC Electron Corporation, both of Tokyo, Japan

[21] Appl. No.: 882,242

[22] Filed: May 8, 1992

Related U.S. Application Data

[63] Continuation of Ser. No. 504,290, Apr. 4, 1990, abandoned.

[30] Foreign Application Priority Data

Apr. 5, 1989 [JP] Japan ................................. 1-86504

[51] Int. Cl.$^5$ ............................................. C30B 15/02
[52] U.S. Cl. .............................................. 117/13; 117/20; 117/932
[58] Field of Search ............... 156/617.1, 618.1, 620.4, 156/DIG. 64; 423/601, 345; 117/20, 13, 932

[56] References Cited

U.S. PATENT DOCUMENTS

| | | | |
|---|---|---|---|
| 3,998,598 | 12/1976 | Bonora | 156/617.1 |
| 4,344,815 | 8/1982 | Cazarra et al. | 156/620.4 |
| 4,417,943 | 11/1983 | Jacques et al. | 156/620.4 |
| 4,511,428 | 4/1985 | Ghosh et al. | 156/617.1 |
| 4,894,206 | 1/1990 | Yamashita et al. | 156/618.1 |

FOREIGN PATENT DOCUMENTS

| | | | |
|---|---|---|---|
| 0042901 | 1/1982 | European Pat. Off. | |
| 0055619 | 7/1982 | European Pat. Off. | |
| 229322 | 7/1987 | European Pat. Off. | 156/617.1 |
| 224887 | 7/1985 | Germany | 156/620.4 |
| 62-202900 | 9/1987 | Japan | 156/620.4 |
| 225143 | 9/1978 | U.S.S.R. | 156/617.1 |
| 8908731 | 9/1989 | WIPO | 156/617.1 |

OTHER PUBLICATIONS

Kuroda et al., Japanese Journal of Applied Physics, vol. 19, No. 7, 1980, Jul. pp. 361–364.
Ponce et al., Applied Physics Letters, 1983, pp. 1051–1053, vol. 43, Dec.

*Primary Examiner*—Robert Kunemund
*Attorney, Agent, or Firm*—Wenderoth, Lind & Ponack

[57] ABSTRACT

A single silicon crystal wafer produced by the Czochvalski method and measuring not less than 100 mm in diameter, a single silicon crystal having low OSF density induced by oxidation, wherein regarding the local resistivity measured by the spread resistance method on the surface of said wafer subjected in advance to a heat treatment for extinction of oxygen donor, the proportion of the number of points of measurement registering errors exceeding ±1.0% of the mean value is not more than 35% of the total number of points of measurement, and regarding the distribution of oxygen concentration in solid solution in the wafer surface, the difference between the maximum and the minimum is not more than 2.0% of the maximum, and a method for production thereof.

5 Claims, 1 Drawing Sheet

SINGLE SILICON CRYSTAL HAVING LOW OSF DENSITY INDUCED BY OXIDATION AND METHOD FOR PRODUCTION THEREOF

This application is a continuation of now abandoned application, Ser. No. 07/504,290 filed Apr. 4, 1990.

BACKGROUND OF THE INVENTION

1. Field of the Invention

This invention relates to a single silicon crystal having low OSF density induced by oxidation and to a method for the production of the single silicon crystal.

2. Description of the Prior Art

Heretofore, various methods have been introduced to the art concerning the growth of single silicon crystals for use in the manufacture of devices of IC, LSI, etc. Among other known methods, the Czochvalski method which effects growth of a single crystal rod by inserting a seed crystal into molten silicon held in a quartz crucible and lifting the seed crystal while rotating it has been finding extensive utility in commercial production of single crystals of silicon (1) because the silicon wafer produced by this method (hereinafter referred to as "CZ wafer") is not readily warped even after it has been subjected repeatedly to a heat treatment and (2) because the CZ wafer produces an intrinsic gettering action and, therefore, defies the otherwise inevitable pollution with heavy metal originating in a process for producing the devices. These two features of the CZ wafer are both ascribable to the oxygen contained in the crystal. In the meantime, this oxygen is a cause for the stacking fault inducible by a heat treatment. When the stacking fault occurs in the active region of a device, it seriously deteriorates the characteristic properties of the device. Efforts have been made, therefore, in search of a method for alleviating the stacking fault. Particularly, the oxidation-induced stacking fault which occurs during the process of oxidation (hereinafter referred to as "OSF") is a very serious problem because heat treatment with oxidation is essential to the process for LSI production. To the device-quality single silicon crystals, the characteristic of sparing susceptibility to the OSF is indispensable. It is widely known that the OSF generating behavior of the single silicon crystal produced by the Czochvalski method (hereinafter referred to as "CZ single silicon crystal") is affected by the condition of crystal growth. The production of a single silicon crystal sparingly susceptible to OSF has been heretofore attained by setting the crystal pulling speed at a level exceeding about 1.3 mm/min (Kinji Hoshi et al, "Nikkei Microdevices, July 1986 issue," pp 87–108).

In recent years, the trend of devices toward scaling down has come to impose an exacting demand on further uniformalization of the dopant concentration distribution in the CZ wafer (which is in proportion to the reciprocal of resistivity). When the single silicon crystal is pulled at such a speed as mentioned above, the uniformity of the dopant concentration distribution cannot be called fully satisfactory as evinced by the test results obtained by the present inventors and shown in Table 3. This statement holds good with the oxygen concentration in the solid solution. When the scaling down of the device's size has advanced further in the future, the demand imposed on the uniformalization is believed to gain all the more in exactitude. Generally, when the crystal pulling speed is high, the uniformity of the dopant and that of oxygen in solid solution tend to dwindle.

Thus, the conventional technique has entailed the disadvantage that an attempt at enhancing the uniformity of the dopant and that of oxygen in solid solution results in disruption of an effort to preclude the occurrence of OSF.

An object of this invention, therefore, is to provide a novel single silicon crystal sparingly susceptible of the occurrence to stacking fault inducible by oxidation, and a method for the production of the single silicon crystal.

Another object of this invention is to fix conditions necessary for ensuring the uniformity of dopant and oxygen in solid solution and, at the same time, precluding the occurrence of OSF and to fix conditions for process control in commercial production of a CZ single silicon crystal fulfilling the requirement of uniformity by the Czochvalski method.

SUMMARY OF THE INVENTION

The objects described above are accomplished by a single silicon crystal wafer produced by the Czochvalski method and measuring not less than 100 mm in diameter, a single silicon crystal having low OSF density induced by oxidation, wherein regarding the local resistivity measured by the spread resistance method on the surface of the wafer subjected in advance to a heat treatment for extinction of oxygen donor, the proportion of the number of points of measurement registering errors exceeding ±1.0% of the mean value is not more than 35% of the total number of points of measurement, and regarding the distribution of oxygen concentration in solid solution in the wafer surface, the difference between the maximum and the minimum is not more than 2.0% of the maximum.

These objects are further accomplished by a method for the production of a single silicon crystal measuring not less than 100 mm in diameter and exhibiting sparing susceptibility to stacking fault inducible by oxidation in accordance with the Czochvalski method, wherein the crystal growth speed v expressed by the denomination of mm/min is fixed as follows:

$v \leq 0.075 [Oi] - 0.10$ (providing $[Oi] > 8.0$) or $v \leq 0.50$ (providing $[Oi] \leq 8.0$)

wherein [Oi] refers to the oxygen concentration in solid solution determined by the infrared absorption spectroscopic method according to the standard method recommended by the 9th Expert Committee, Japan Electronic Industry Development Association and expressed by the denomination of $[10^{17}$ atoms/cm$^3]$.

The CZ wafer of the present invention exhibits sparing susceptibility to OSF and heretofore unattainable high uniformity of dopant and oxygen concentration distribution in solid solution. Thus, it forms an ideal material for the production of devices such as IC, LSI, etc. and contributes to improving the device quality and enhancing production yield.

EXPLANATION OF THE PREFERRED EMBODIMENT

Figure 1:
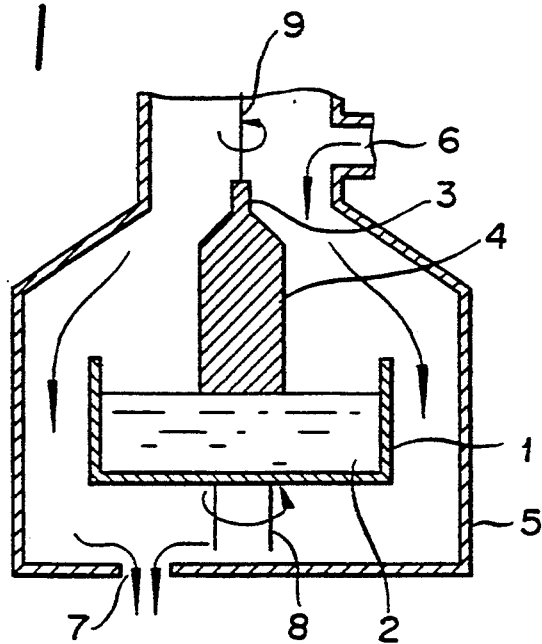
FIG. 1 is a diagram illustrating a typical construction of the apparatus for production in accordance with the Czochvalski method.

Now, the construction and operation of this invention will be described specifically below with reference to the accompanying drawings.

First, the method for evaluation of the OSF generating property of the single silicon crystal of this invention will be described with reference to Table 1. A single silicon crystal bar produced by the Czochvalski method and measuring not less than 100 mm is sliced. A slice of single silicon crystal thus obtained is subjected to various process steps such as the heat treatment for extinction of oxygen donor, lapping, and polishing which are generally performed in commercial production of silicon wafers. The wafer thus produced is cleaned (1), pyrogenically oxidized at 1,100° C. for 60 minutes (2), immersed in an aqueous HF solution for removal of surface oxide film (3), and thereafter given a Wright etching (etching amount about 1.5 μm) for 90 seconds to allow determination of the number of pits formed by the etching on the wafer surface under a microscope (4). From the surface areas of several adjoining fields of view (about 0.52 mm×0.35 mm) arranged, the OSF density in each of the sites of measurement is determined. In the present invention, the determination of the OSF density mentioned above is performed on the entire wafer surface. The OSF generating property of a given single silicon crystal is rated by the maximum of the OSF density so determined. In the case of the single silicon crystal of the present invention, the maximum OSF density is not more than 20/cm$^2$ in a wafer of the plane orientation of (111) and not more than 50/cm$^2$ in a wafer of the plane orientation of (100) as noted clearly from the results of working examples indicated in Table 3.

Now, the method for evaluation of the uniformity of dopant concentration distribution in the single silicon crystal of the present invention will be described below with reference to Table 2. A single silicon crystal bar produced by the Czochvalski method and measuring not less than 100 mm is sliced. A slice of single silicon crystal thus obtained is subjected to various process steps such as heat treatment for extinction of oxygen donor, lapping, and polishing which are generally performed in commercial production of silicon wafers. The wafer thus produced is cleaned (1), immersed in an aqueous ammonium fluoride solution for removal of a very thin oxide film formed on the surface of the wafer (2), and then baked in nitrogen gas for stabilization of the surface condition of the wafer (3). The determination of the spread resistance (4) yields a dispersed result when the pretreatments mentioned above are omitted and the data consequently gathered suffers from extremely poor reliability. In this invention, the determination of spread resistance is performed at intervals of 50 μm from the center to the edge of the wafer. The uniformity of the dopant concentration distribution in the single silicon crystal is evaluated by the proportion of the number of points of measurement registering errors exceeding ±1.0% of the mean value of local resistivity relative to the total number of points of measurement. As clearly noted from the results of the working example indicated in Table 3, the ratio of deviation of resistivity in the single silicon crystal of this invention is not more than 35%.

Now, the method for evaluation of the uniformity of oxygen concentration distribution in solid solution in the single silicon crystal of the present invention will be described below. A single silicon crystal bar produced by the Czochvalski method and measuring not less than 100 mm is sliced. A slice of single silicon crystal thus obtained is subjected to various process steps such as heat treatment for extinction of oxygen donor, lapping, and polishing which are generally performed in commercial production of silicon wafers. The wafer thus produced is tested for oxygen concentration in the solid solution of the wafer in accordance with the infrared absorption spectroscopic method established by the Japan Electronic Industry Development Association. In the present invention, spots of measurement 4 mm in diameter are arranged in the radial direction from the edge to the site of 10 mm in the center of the wafer as separated by fixed intervals of 4 mm. The uniformity of oxygen concentration distribution in the solid solution of the single silicon crystal is rated by the ratio of the difference between the maximum and the minimum to the maximum. As noted clearly from the results of the working example indicated in Table 3, the lack of uniformity of the oxygen in the solid solution of the single silicon crystal of this invention is not more than 2.0%.

FIG. 1 depicts a typical apparatus for the production of a single silicon crystal bar of this invention by the Czochvalski method. The construction of this apparatus will be described briefly below. Inside a chamber 5 provided with a gas inlet 6 and a gas outlet 7, a crucible 1 made of quartz glass is disposed as supported on a supporting shaft 8 adapted to impart rotation to the crucible 1. Above this crucible 1, a pulling wire 9 adapted to retain at the leading end thereof a seed crystal 3 with the aid of a chuck (not shown) is disposed. This apparatus is further provided with resistance heating or induction heating means for melting polycrystalline silicon placed in the crucible 1 into a melt 2 as the raw material and a wire winder for taking up the wire 9 (both not shown).

Figure 2:
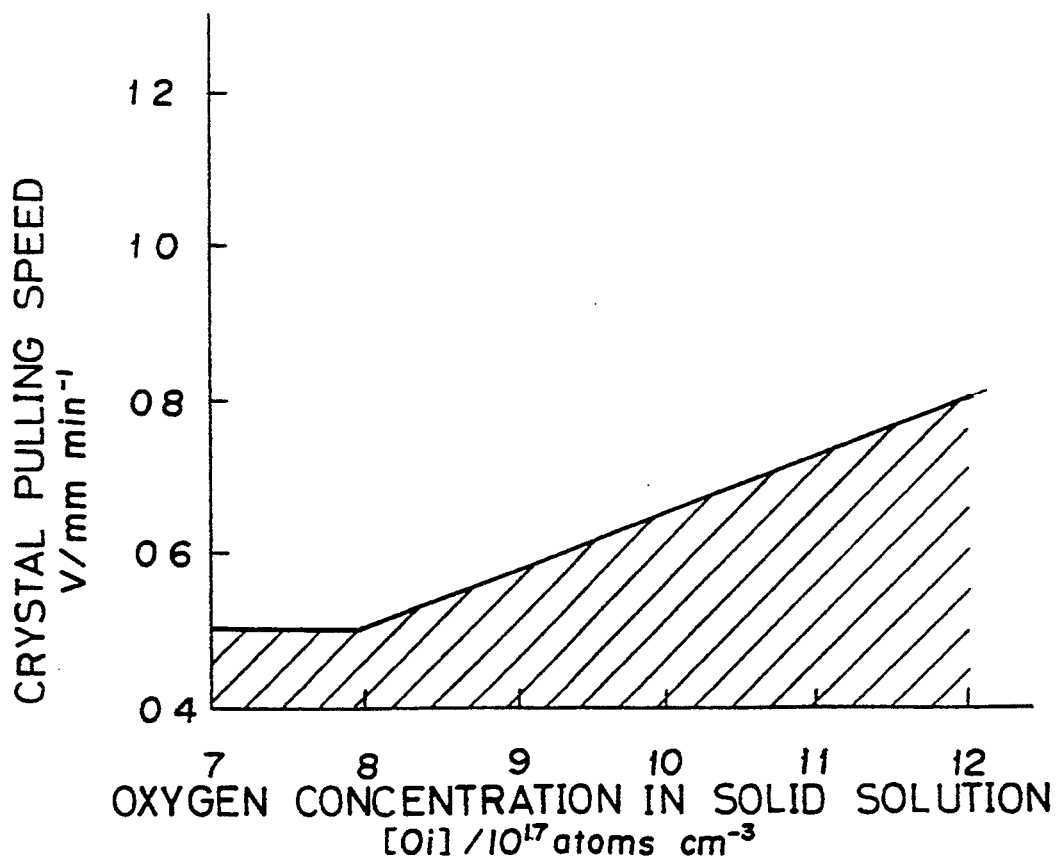
FIG. 2 is a diagram aiding in the description of conditions for the production of a single silicon crystal of the present invention.

This invention, while pulling a single crystal bar 4 from the melt 1 of raw material held in the crucible and effecting growth of a single silicon crystal in the solid-liquid boundary surface by the use of the apparatus constructed as illustrated in FIG. 1, fixes the crystal growth speed v expressed by the denomination of mm/min in the following range:

$v \leq 0.075$ [Oi]$-0.10$, preferably $0.2 \leq v \leq 0.45$ (providing that [Oi]$>8.0$) or $v \leq 0.50$, preferably $0.2 \leq v \leq 0.45$ (providing that [Oi]$\leq 8.0$), namely in the range indicated by the hatched range in FIG. 2. When the pulling speed exceeds this range, the maximum of the OSF density exceeds 20/cm$^2$ in a wafer of a plane orientation of (111) (angle of inclination 4 degrees) or 50/cm$^2$ in a wafer of a plane orientation of (100) and the single silicon crystal becomes susceptible to OSF. Also the ratio of deviation of the resistivity exceeds 35% and the lack of uniformity of oxygen in the solid solution exceeds 2.0%. So long as the pulling speed falls within the range of FIG. 2, the maximum of the OSF density is not more than 20/cm$^2$ in a wafer of a plane orientation of (111) and not more than 50/cm$^2$ in a wafer of a plane orientation of (100), the ratio of deviation of the resistivity is not more than 35%, and the lack of uniformity of oxygen in the solid solution in the wafer surface is not more than 2.0%. When the pulling speed is less than 0.5 mm/min, the maximum of the OSF density is not more than 5 /cm$^2$ in any wafer, the ratio of deviation of the resistivity is less than 21%, and the lack of uniformity of oxygen in the solid solution within the wafer surface is less than 1.4%. As the result, there is obtained a single silicon crystal hardly susceptible to OSF and excellent in uniformity of dopant and oxygen concentration distribution in solid solution, and ideally suitable for production of devices as discussed above.

The [Oi] is mainly affected by a rotation speed of a crucible 1(See FIG. 1), and when the rotation speed increases, the [Oi] becomes higher. Considering the necessary properties of the wafer and effect of operation conditions, the aimed value of the [Oi] is usually set, so the pulling speed is decided based on this value in accordance with the present invention. The pulling speed is generally controlled by a mechanical pulling speed in combination with heating condition such as power of a heater for heating the crucible.

The single silicon crystal of the present invention is characterized by the fact that the ratio of deviation of resistivity is not more than 35%, preferably not more than 21% and the lack of uniformity of oxygen in the solid solution is not more than 2.0%, preferably not more than 1.4% in addition to the fact that the single silicon crystal is sparingly susceptible to OSF. The single silicon crystal not conforming to the present invention, namely the conventional single silicon crystal, does not simultaneously satisfy the three characteristic properties as evinced by the data for the controls (R) indicated in Table 3. A single silicon crystal not conspicuously susceptible to OSF may be obtained by fixing the pulling speed of the crystal at a larger level such as, for example, 1.3 mm/min. The single silicon crystal obtained in this case fails to acquire the uniformity of dopant and oxygen in the solid solution as contemplated by the present invention and does not fall in the range of this invention. When a single silicon crystal wafer produced by the Czochvalski method and measuring not less than 100 mm in diameter is such that the ratio of deviation of resistivity on the wafer surface subjected in advance to a heat treatment for extinction of oxygen donor is not more than 35%, the lack of uniformity of oxygen in the solid solution within the wafer surface is not more than 2.0%, and the maximum of the OSF density is not more than $20/cm^2$, preferably not more than $5 /cm^2$, in a wafer of a lattice plane of (111) and not more than $50/cm^2$, preferably not more than $5 /cm^2$ in wafer of a plane orientation of (100), and the susceptibility to the stacking fault induced by oxygen is negligible, it may be judged to have been manufactured by the method of the present invention. When the single silicon crystal of the present invention is such that the maximum of the OSF density is not more than $5/cm^2$, the ratio of deviation of resistivity is less than 21%, and the lack of uniformity of oxygen in the solid solution within the wafer surface is less than 1.4%, it is safe to conclude that the pulling speed of the crystal has been not more than 0.5 mm/min. The conditions fall within the range of this invention.

Now, the present invention will be described more specifically below with reference to working examples.

EXAMPLES 1 to 19

By the use of an apparatus constructed as illustrated in FIG. 1, single crystals were grown, where the amount of a melt 2 as raw material before pulling the crystal is varied in the range of 35 to 65 kg, the flow volume of argon as an inert gas is varied in the range of 50 to 100 Nl/min, and the pulling speed v [mm/min] of a single silicon crystal bar 4 is varied in the range expressed as follows:

$v \leq 0.075 [Oi] - 0.10$ (providing that $[Oi] > 8.0$), or
$v \leq 0.50$ (providing that $[Oi] \leq 8.0$).

Separately, for comparison with the single silicon crystals of this invention, single silicon crystal bars were produced at pulling speeds exceeding the range mentioned above. In Example 4, a polycrystalline silicon as raw material was continuously supplied to the melt 2 and the single silicon crystal bar was pulled at a speed of 0.4 mm/min. A wafer was sliced from each of the single crystals thus produced and subjected to various process steps such as oxygen donor treatment, lapping, and polishing which are generally required for commercial production of silicon wafers, to obtain a CZ wafer possessing a specular surface on one side thereof.

The OSF generating property of the CZ wafer was evaluated by finding the maximum of the OSF density of the wafer through the process of Table 1 described above. The uniformity of dopant and that of oxygen concentration distribution in the solid solution were evaluated by finding the ratio of deviation of resistivity and the lack of uniformity of oxygen in the solid solution as described above.

It is clearly noted from the results indicated in Table 3 that single silicon crystals sparingly susceptible to OSF, excellent in uniformity of dopant and uniformity of oxygen concentration distribution in the solid solution, and ideally usable for the manufacture of the foregoing devices are obtained by using pulling speeds falling within the range of this invention.

TABLE 1

| No. | Step of process | Conditions |
|---|---|---|
| 1 | Washing of wafer | (1) 10 min. washing with a 1:1 5 (vol.) mixture of 29% $NH_4OH$:31% $H_2O_2$:$H_2$= 1:1:5 (vol.) at 80° C., followed by two cycle of 5 min. rinsing with water (2) 1 min. immersion in a 1:10 (vol.) mixture of 15% HF:$H_2O$ at room temperature, followed by two cycles of 5 min. rinsing with water, (3) 10 min. washing with a 1:1:5 (vol.) mixture of 36% HCl:31% $H_2O_2$:$H_2O$ at 80° C., followed by two cycles of 10 min. rinsing with water, and (4) 1 min. immersion in a 1:10 (vol.) mixture of 25% HF:$H_2O$ at room temperature, followed by two cycles of 5 min. rinsing with water, finally spin-dried. |
| 2 | High temperature oxidation | Oxidation (1100° C., 60 min.) |
| 3 | Removal of oxide film | Immersion in 10 wt % HF (followed by confirmation of hydrophobicity) |
| 4 | Wright etching | 90 sec. (etching amount about 1.5 μm on one surface) |
| 5 | Determination of OSF density | Observation under optical microscope |

TABLE 2

| No. | Step of process | Conditions |
|---|---|---|
| 1 | Washing of wafer | (1) 10 min. washing with a 1:1:5 (vol.) mixture of 29% $NH_4OH$:$H_2O_2$:$H_2O$ at 80° C., followed by two cycles of 5 min. rinsing with water and (2) spin drying. |

TABLE 2-continued

| No. | Step of process | Conditions |
|---|---|---|
| 2 | Removal oxide film | 10 min. washing with (1) 1% NH4F solution at room temperature, followed by two cycles of 10 min. rinsing with water and (2) spin drying. |
| 3 | Stabilization of surface | 100° C. for 10 min. for N type wafer, 250° C. for 30 min. for P type wafer in nitrogen |
| 4 | Determination of spread resistance | Probe interval 100 μm, probe load 20 g, of probe material: tungsten-osmium alloy (contact diameter 5 μm), internval of measurement: 50 μm. |

TABLE 3

| Sample No. | Crystal pulling speed [mm/min] | Resistivity [Ωcm] | Oxygen concentration [$10^{17}$/cm$^{-3}$] | Carbon concentration [$10^{15}$/cm$^{-3}$] | Type | Plane orientation | Maximum of OSF density [cm$^{-2}$] |
|---|---|---|---|---|---|---|---|
| 1 | 0.4 | 6.08 | 7.23 | <1.00 | P | (100)K | 0 |
| 2 | 0.4 | 8.21 | 8.66 | 3.72 | P | (100) | 5 |
| 3 | 0.4 | 10.45 | 9.81 | 5.66 | P | (100) | 5 |
| 4 | 0.4 | 11.74 | 10.11 | <1.00 | P | (100)K | 0 |
| 5 | 0.6 | 16.72 | 10.25 | <1.00 | P | (100) | 26 |
| 6 | 0.5 | 12.33 | 9.25 | 10.44 | P | (100) | 5 |
| 7 | 0.6 | 3.74 | 9.80 | <1.00 | N | (100) | 31 |
| 8 | 0.5 | 1.01 | 8.25 | <1.00 | P | (100) | 5 |
| 9 | 0.8 | 8.43 | 10.22 | <1.00 | P | (111)K | >1038 |
| 10 | 0.8 | 12.57 | 10.08 | 1.24 | N | (111)K | >1038 |
| 11 | 0.4 | 8.86 | 9.29 | <1.00 | P | (111)K | 0 |
| 12 | 0.4 | 10.96 | 8.67 | <1.00 | N | (111)K | 0 |
| 13 | 0.6 | 12.71 | 10.38 | 4.11 | P | (100) | 31 |
| 14 | 0.7 | 8.52 | 9.99 | <1.00 | P | (100) | 42 |
| 15 | 0.8 | 6.44 | 7.85 | 1.19 | P | (100) | 10 |
| 16 | 0.9 | 11.33 | 11.62 | <1.00 | P | (100) | >1038 |
| 17 | 1.1 | 10.45 | 9.99 | <1.00 | N | (100) | 62 |
| 18 | 1.5 | 10.87 | 10.42 | 1.23 | P | (100) | 36 |
| 19 | 2.0 | 8.26 | 10.44 | <1.00 | P | (100) | 0 |

| Sample No. | Ratio of deviation of resistivity [%] | Lack of uniformity of oxygen in solid solution [%] | Classification | Remarks |
|---|---|---|---|---|
| 1 | 15.3 | 0.7 | H | |
| 2 | 12.7 | 0.8 | H | |
| 3 | 10.4 | 0.8 | H | |
| 4 | 11.0 | 1.0 | H | G |
| 5 | 24.2 | 1.5 | H | |
| 6 | 16.3 | 0.9 | H | |
| 7 | 25.5 | 1.4 | H | |
| 8 | 16.9 | 0.9 | H | |
| 9 | 57.9 | 2.4 | R | |
| 10 | 67.2 | 2.2 | R | |
| 11 | 10.3 | 0.9 | H | |
| 12 | 12.7 | 1.0 | H | |
| 13 | 21.4 | 1.8 | H | |
| 14 | 25.5 | 1.9 | H | |
| 15 | 35.8 | 2.0 | R | |
| 16 | 40.3 | 3.3 | R | |
| 17 | 68.7 | 2.5 | R | |
| 18 | 52.1 | 2.5 | R | |
| 19 | 61.1 | 3.4 | R | |

K for angle of inclination 40, H for working example of the present invention, R for control, and G for continuous supply of raw material

What is claimed is:

1. A single silicon crystal, used for wafers, said crystal being produced by the Czochvalski method at a crystal growth speed v of less than 0.5 mm/min and measuring not less than 100 mm in diameter, the single silicon crystal having an OSF density induced by oxidation of not more than 5/cm², wherein regarding the local resistivity measured by the spread resistance method on the surface of said crystal subjected in advance to a heat treatment for extinction of oxygen donor, the proportion of the number of points of measurement registering errors exceeding ±1.0% of the mean value is not more than 21% of the total number of points of measurement, and regarding the distribution of oxygen concentration in solid solution in the crystal surface, the difference between the maximum and the minimum is less than 1.4% of the maximum.

2. A method for the production of a single silicon crystal, used for wafers, said crystal measuring not less than 100 mm in diameter and exhibiting sparing susceptibility to stacking fault inducible by oxidation, which comprises conducting the Czochvalski method at a crystal growth speed v of less than 0.5 mm/min to produce a single silicon crystal having an OSF density induced by oxidation of not more than 5/cm², wherein regarding the local resistivity measured by the spread resistance method on the surface of said crystal subjected in advance to a heat treatment for extinction of oxygen donor, the proportion of the number of points of measurement registering errors exceeding +1.0% of the mean value is not more than 21% of the total number of points of measurement, and regarding the distribution of oxygen concentration in solid solution in the crystal surface, the difference between the maximum and the minimum is less than 1.4% of the maximum.

3. A method according to claim 1, wherein the crystal growth speed v is in the following range:

$$0.2 \leqq v \leqq 0.45$$

4. A method according to claim 2, wherein the plane orientation of said single silicon crystal is (111).

5. A method according to claim 2, wherein the plane orientation of said single silicon crystal is (100).

* * * * *